United States Patent
Chu et al.

(10) Patent No.: US 7,749,866 B2
(45) Date of Patent: Jul. 6, 2010

(54) METHOD FOR SAWING A WAFER AND METHOD FOR MANUFACTURING A SEMICONDUCTOR PACKAGE BY USING A MULTIPLE-TYPE TAPE

(75) Inventors: Fu Tang Chu, Fengshan (TW); Chi Yuam Chung, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 38 days.

(21) Appl. No.: 12/017,931

(22) Filed: Jan. 22, 2008

(65) Prior Publication Data
US 2008/0176360 A1    Jul. 24, 2008

(30) Foreign Application Priority Data
Jan. 23, 2007    (TW) ............................... 96102445 A

(51) Int. Cl.
*H01L 21/301*    (2006.01)

(52) U.S. Cl. ............... 438/460; 438/113; 257/E21.499; 257/E21.599

(58) Field of Classification Search ................ 438/113, 438/460; 257/E21.499, E21.599
See application file for complete search history.

(56) References Cited

U.S. PATENT DOCUMENTS

| | | | | |
|---|---|---|---|---|
| 6,620,651 B2 * | 9/2003 | He et al. | ...................... | 438/113 |
| 6,864,154 B2 * | 3/2005 | Yoon et al. | .................. | 438/459 |
| 7,129,118 B2 * | 10/2006 | Yoo et al. | .................... | 438/113 |
| 7,358,158 B2 * | 4/2008 | Aihara et al. | ............... | 438/464 |
| 2002/0076905 A1 * | 6/2002 | Lin et al. | .................... | 438/465 |

* cited by examiner

*Primary Examiner*—Charles D Garber
*Assistant Examiner*—Stanetta D Isaac

(57) ABSTRACT

A method for sawing a wafer includes the following steps. A wafer which has an active surface, a back surface and a plurality of longitudinal and transverse sawing lines is provided, wherein the sawing lines are located on the active surface so as to define a plurality of dies. A multiple-type tape is attached on the active surface of the wafer, wherein the multiple-type tape includes a first tape and a second tape, the second tape is located between the first tape and the active surface of the wafer, and the second tape is transparent. The back surface of the wafer is grinded. The first tape is removed. Finally, the wafer including the second tape is sawn along the sawing lines so as to separate the dies from one another.

15 Claims, 11 Drawing Sheets

METHOD FOR SAWING A WAFER AND METHOD FOR MANUFACTURING A SEMICONDUCTOR PACKAGE BY USING A MULTIPLE-TYPE TAPE

CROSS REFERENCE TO RELATED APPLICATION

This application claims the priority benefit of Taiwan Patent Application Serial Number 096102445, filed Jan. 23, 2007, the full disclosure of which is incorporated herein by reference.

BACKGROUND OF THE INVENTION

1 Field of the Invention

The present invention generally relates to a method for sawing a wafer, and more particularly to a method for manufacturing a semiconductor package by using a multiple-type tape which can prevent the active surface of the wafer from the pollution.

2. Description of the Related Art

The process for manufacturing semiconductor packages generally includes the following steps. First, a wafer is sawn to a plurality of dies. Then, the dies are manufactured to semiconductor packages having a variety of functions. FIGS. 1-6 show that a conventional method for sawing a wafer includes the following steps. First, a wafer which has an active surface and a back surface is provided. Referring to FIG. 1, a grinding tape 20 is attached on the active surface 16 of the wafer 10. Referring to FIG. 2, the back surface 14 of the wafer 10 is grinded by a mechanical grinding device 50. Referring to FIG. 3, a dicing tape 40 is attached on the back surface 14 of the grinded wafer 10, wherein the dicing tape 40 includes a bottom film 42 and a die attach film 44. Referring to FIG. 4, the grinding tape 20 is removed and parted from the active surface 16 of the wafer 10, and the wafer 10 is mounted on a wafer rack 18 by the dicing tape 40. Referring to FIG. 5, the wafer 10 is sawn along the sawing lines 32 by a sawing device so as to separate the dies from one another. Finally, referring to FIG. 6, the sawn die 12 is picked up by a vacuum device 60 so as to finish singularizing the dies 12, wherein the die attach film 44 is still attached on the dies 12. In addition, FIGS. 7 and 8 further show a convention method for manufacturing a semiconductor package. Referring to FIG. 7, the dies 12 including the die attach film 44 is moved and attach to a substrate 70 or a leadframe (not shown) by the vacuum device 60, and the dies 12 is mounted on the substrate 70 by heating the die attach film 44. Referring to FIG. 8, the vacuum device 60 is removed, and the active surface 16 of the wafer 10 is cleaned by a plasma clean process. Finally, a semiconductor package is completely manufactured by a wire bonding process and an encapsulating process.

However, chipping of die easily occurs when the thin wafer is sawn. Furthermore, the chipping can pollute the active surface of the die in the conventional method for sawing the wafer. Thus, it is necessary that the active surface of the wafer is cleaned by the plasma clean process in the convention method for manufacturing semiconductor package. For above reason, the convention method for manufacturing semiconductor package can increase the manufacture time and cost.

Accordingly, there exists a need for a method for sawing a wafer and a method for manufacturing semiconductor package capable of solving the above-mentioned problems.

SUMMARY OF THE INVENTION

It is an object of the present invention to provide a method for sawing a wafer, wherein the method utilizes a multiple-type tape which can prevent the active surface of the wafer from the pollution of scraps of the wafer during the sawing process.

It is another object of the present invention to provide a method for sawing a wafer, wherein the method utilizes a multiple-type tape that can support the thin wafer and prevent the thin wafer from exhibiting die chipping.

It is a further object of the present invention to provide a method for manufacturing a semiconductor package, wherein the method utilizes a multiple-type tape which can prevent the active surface of the wafer from the pollution, and thus it is not necessary that the active surface of the wafer is cleaned by a plasma clean process.

In order to achieve the foregoing object, the present invention provides a method for sawing a wafer including the following steps. A wafer which has an active surface, a back surface and a plurality of longitudinal and transverse sawing lines is provided, wherein the sawing lines are located on the active surface so as to define a plurality of dies. A multiple-type tape is attached on the active surface of the wafer, wherein the multiple-type tape includes a first tape and a second tape, the second tape is located between the first tape and the active surface of the wafer, and the second tape is transparent. The back surface of the wafer is grinded. The first tape is removed. Finally, the wafer including the second tape is sawn along the sawing lines so as to separate the dies from one another.

Compared with the prior art, the method for sawing the wafer according to an embodiment of the present invention utilizes a multiple-type tape which can prevent the active surface of the wafer from the pollution of scraps of the wafer during the sawing process or solve the scrape problem resulted from foreign objects. Furthermore, the multiple-type tape can support the thin wafer and prevent the thin wafer from exhibiting die chipping.

The present invention further provides a method for manufacturing a semiconductor package including the following steps. The above-mentioned die including the second tape and the die attach film is moved and attached to a carrier. The die is mounted on the carrier and the adhesion of the second tape is destroyed by a method for simultaneously processing the die attach film and the second tape. The second tape is removed. The semiconductor package is completely manufactured by a packaging process.

The method for manufacturing the semiconductor package according to the present invention utilizes the second tape of the multiple-type tape which can prevent the active surface of the wafer from the pollution or solve the scrape problem resulted from foreign objects. Furthermore, compared with the prior art, it is not necessary that the active surface of the wafer is cleaned by a plasma clean process in the method for manufacturing the semiconductor package according to the present invention so as not to increase the manufacture time and cost.

The foregoing, as well as additional objects, features and advantages of the invention will be more apparent from the following detailed description, which proceeds with reference to the accompanying drawings.

BRIEF DESCRIPTION OF THE DRAWINGS

FIG. 10b is a partially enlarged cross-sectional view showing A-portion shown in FIG. 10a.

DETAILED DESCRIPTION OF THE PREFERRED EMBODIMENT

Figure 1:
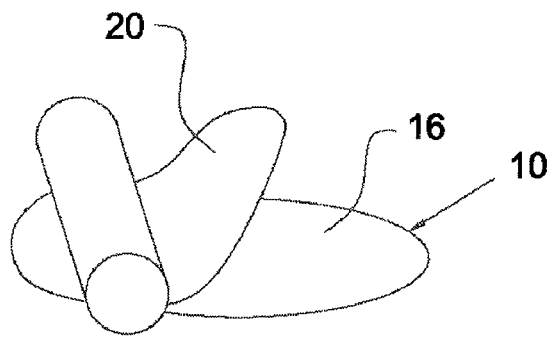
FIGS. 1 to 6 are perspective views showing a method for sawing a wafer in the prior art.
Figure 2:
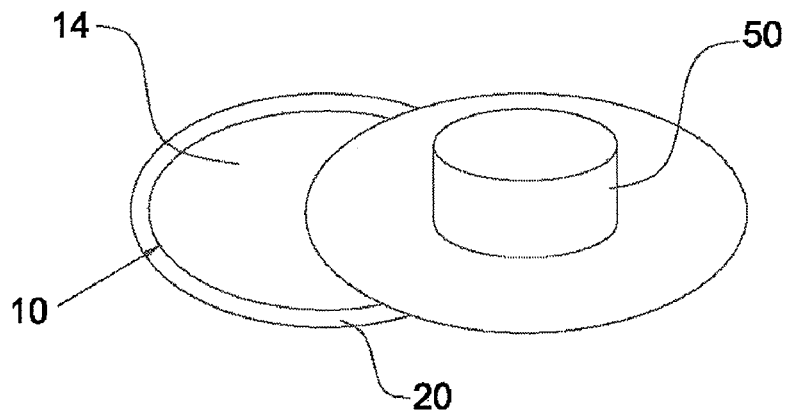
Figure 3:
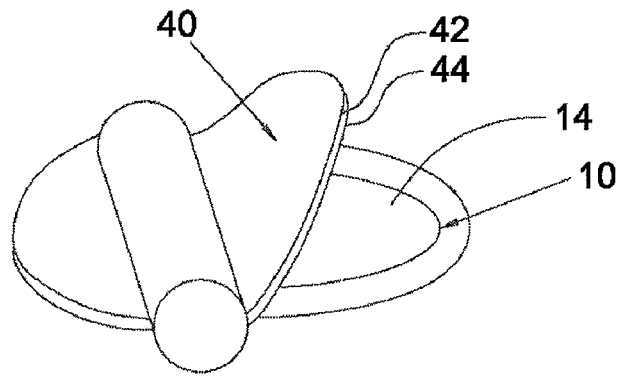
Figure 4:
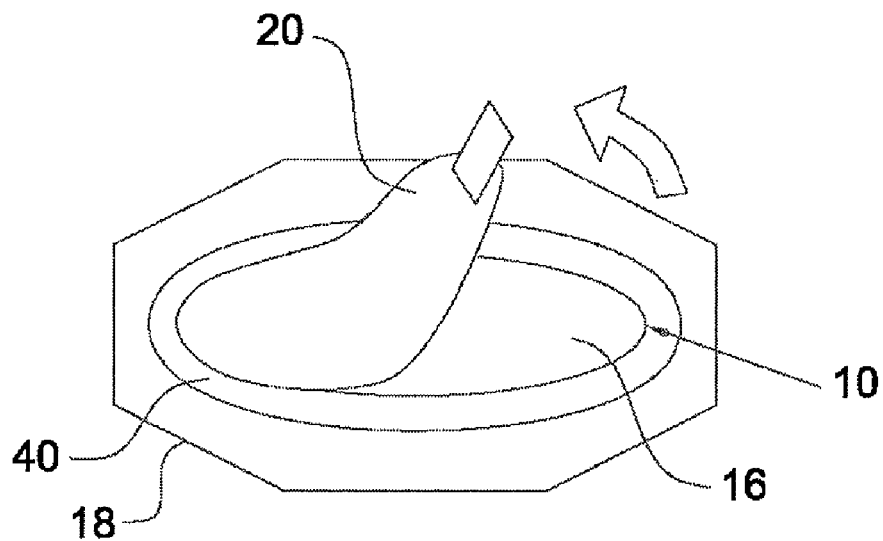
Figure 5:
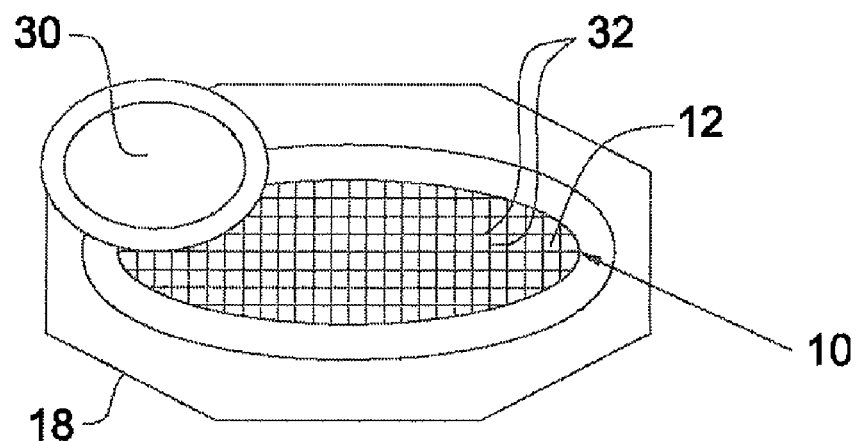
Figure 6:
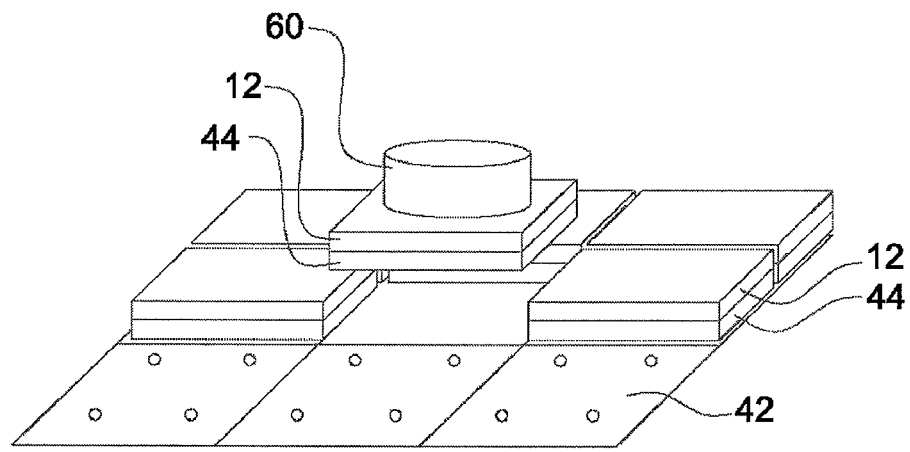
Figure 7:
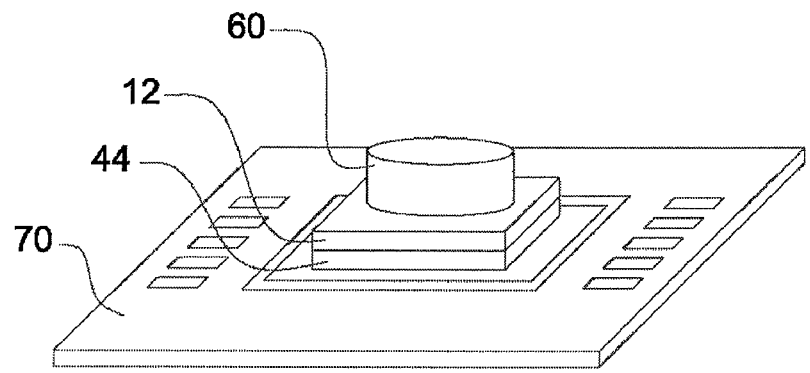
FIGS. 7 to 8 are perspective views showing a method for method for manufacturing a semiconductor package in the prior art.
Figure 8:
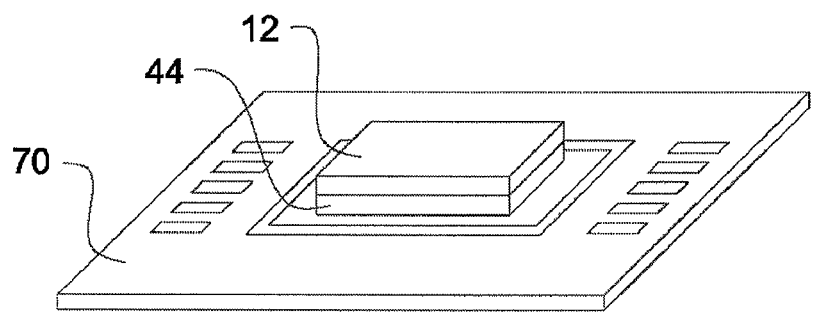
Figure 9:
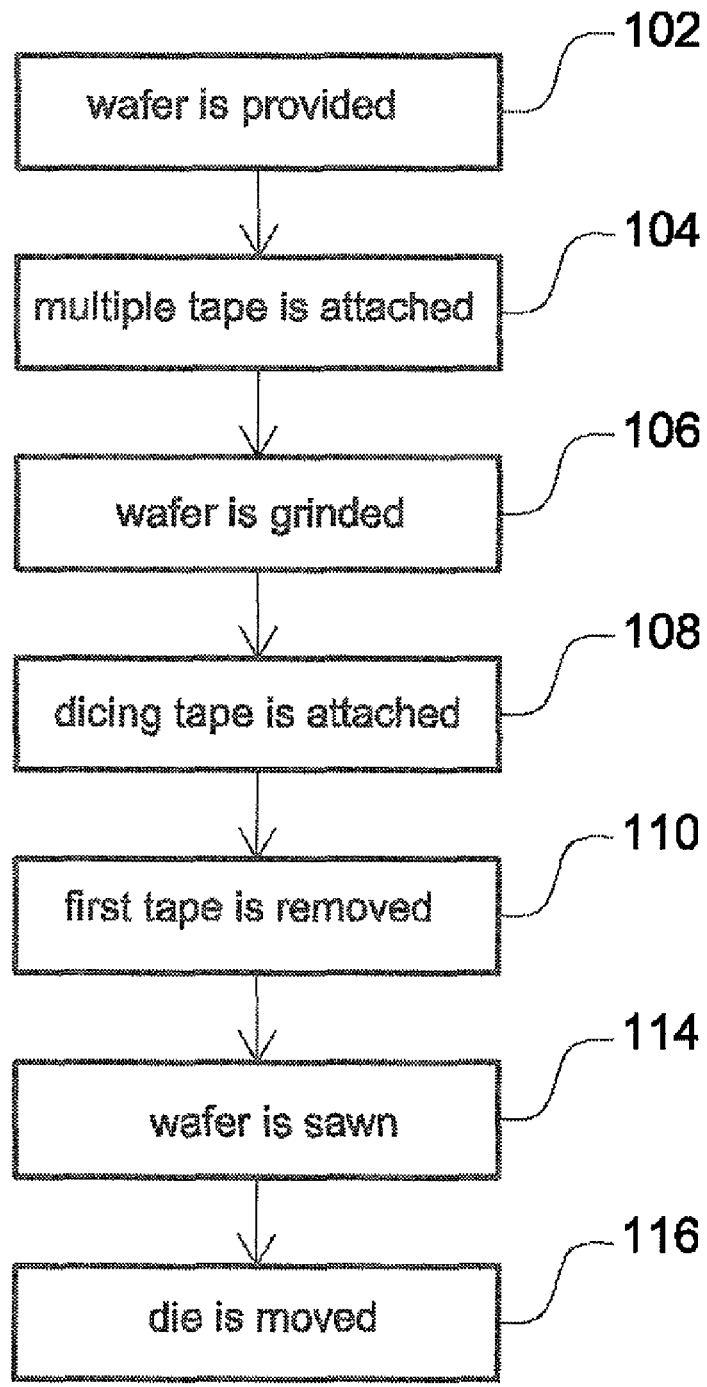
FIG. 9 is a flow diagram showing a method for sawing a wafer according to an embodiment of the present invention.
Figure 10A:
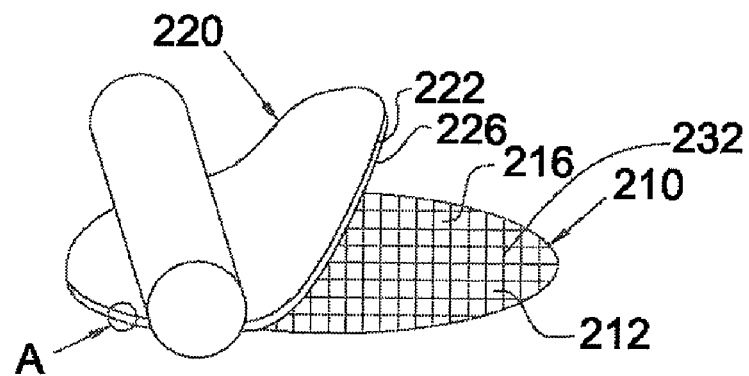
FIG. 10a is a perspective view showing a method for sawing a wafer according to the embodiment of the present invention.
Figure 10B:
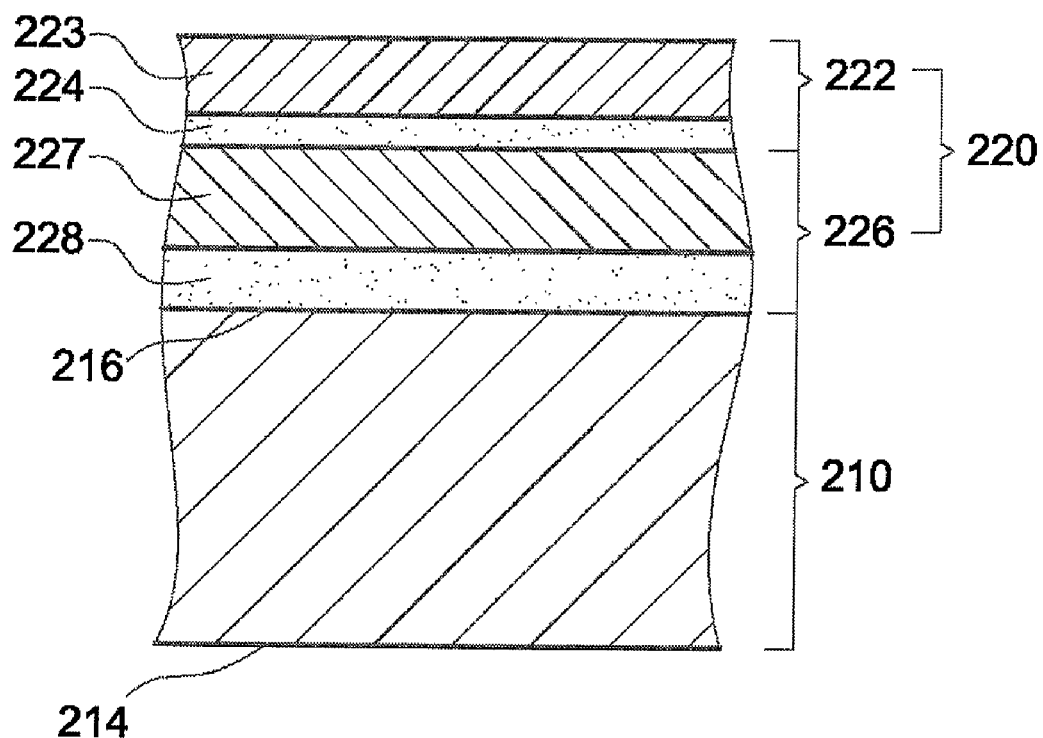

Referring to FIG. 9, it depicts a method for sawing a workpiece (e.g. wafer) according to an embodiment of the present invention. Referring to FIGS. 10a and 10b, in the step 102 a wafer 210 which has an active surface 216, a back surface 214 and a plurality of longitudinal and transverse sawing lines 232 is firstly provided, wherein the sawing lines 232 are located on the active surface 216 so as to define a plurality of dies 212. The active surface 216 of the wafer 210 is provided with integrated circuits (not shown).

Referring to FIG. 10a again, in the step 104 a multiple-type tape 220 is attached on the active surface 216 of the wafer 210, wherein the multiple-type tape 220 includes a first tape 222 and a second tape 226, the second tape 226 is located between the first tape 222 and the active surface 216 of the wafer 210, the force of adhesion between the first tape 222 and the second tape 226 is smaller than the force of adhesion between the second tape 226 and the wafer 210, and the second tape 226 is transparent. Referring to FIG. 10b again, the first tape 222 includes a first base 223 and a first adhesive layer 224, and the second tape 226 includes a second base 227 and a second adhesive layer 228. The adhesion value of the first adhesive layer 224 is less than that of the second adhesive layer 228. Preferably, the thickness of the first base 223 is approximately 90 μm, the thickness of the first adhesive layer 224 is approximately 10 μm, the thickness of the second base 227 is approximately 90 μm, and the thickness of the second adhesive layer 228 is approximately 20 μm. The first tape 222 is a typical grinding tape. The second base 227 of the second tape 226 is transparent, and is made of material which has a predetermined hardness value and is uneasily deformed so as to prevent the wafer from the warping. The second adhesive layer 228 of the second tape 226 is transparent, and the adhesion of the second adhesive layer 228 can be destroyed by a thermal energy or the ultraviolet (UV) rays, wherein the thermal energy can be generated by heating the second adhesive layer 228 to approximately 130 to 150 degrees centigrade.

Figure 11:
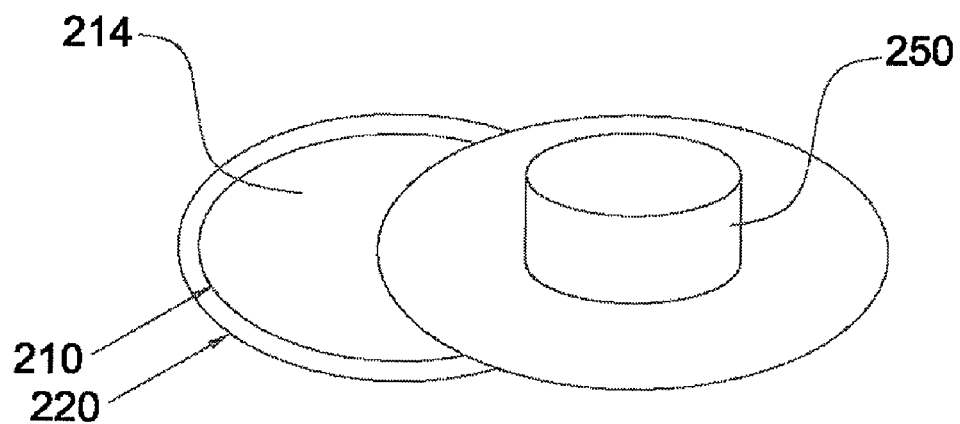
FIGS. 11 to 15 are perspective views showing a method for sawing a wafer according to the embodiment of the present invention.
Figure 12:
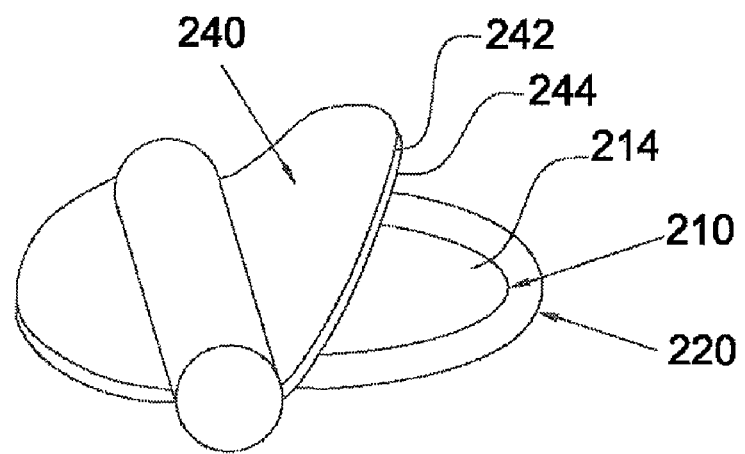
Figure 13:
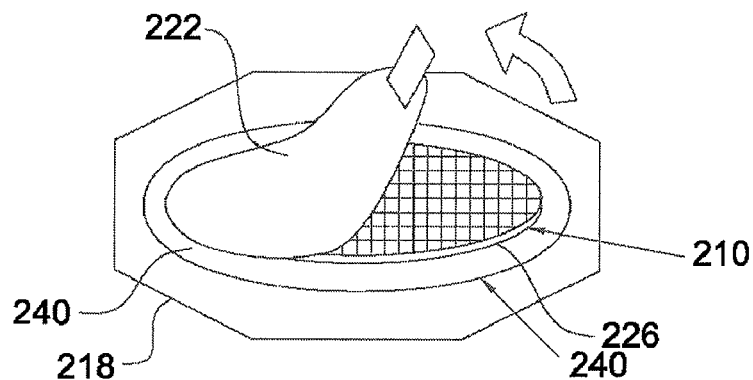

Referring to FIG. 11, in the step 106 the back surface 214 of the wafer 210 is grinded to a predetermined thickness by a mechanical grinding device 250. Referring to FIG. 12, in the step 108 a dicing tape 240 is attached on the back surface 214 of the grinded wafer 210, wherein the dicing tape 240 includes a bottom film 242 and a die attach film 244, and the adhesion value of the bottom film 242 is less than that of the die attach film 244. Referring to FIG. 13, in the step 110 the first tape 222 is removed and parted from the second tape 226 on the wafer 210, and the wafer 210 is mounted on a wafer rack 218 by the dicing tape 240. The force of adhesion between the first tape 222 and the second tape 226 is smaller than the force of adhesion between the second tape 226 and the wafer 210, and thus the second tape 226 is still attached on the active surface 216 of the wafer 210.

Figure 14:
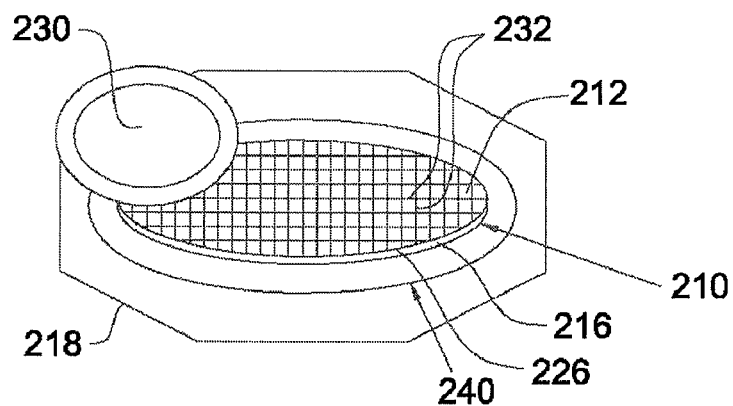

Referring to FIG. 14, in the step 114 the wafer 210 having the second tape 226 is sawn along the sawing lines 232 by a sawing device 230 so as to separate the dies 212 from one another. The second tape 226 is transparent, and thus the second tape 226 cannot hinder the sawing device 230 from sawing the wafer 210 along the sawing lines 232. The second tape 226 can prevent the active surface 216 of the wafer 210 from the pollution of scraps of the wafer 210 during the sawing process. Furthermore, the second tape 226 can support thin wafer 210 and prevent the wafer 210 from exhibiting die chipping.

Figure 15:
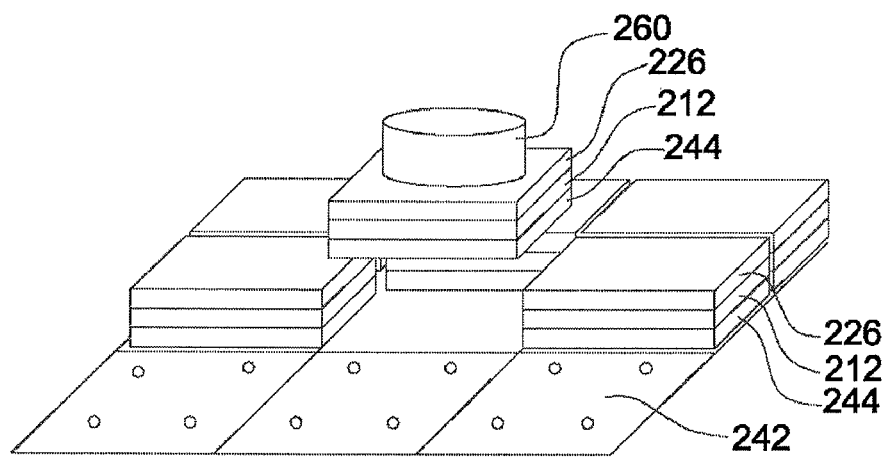

Referring to FIG. 15, in the step 116 the sawn die 212 is picked up and moved from the bottom film 242 by a vacuum device 260 so as to finish singularizing the dies 212, wherein the second tape 226 and the die attach film 244 is attached on the dies 212. The adhesion value of the bottom film 242 is less than that of the die attach film 244, and thus the die attach film 244 is still attached on the dies 212.

Compared with the prior art, the method for sawing the wafer according to an embodiment of the present invention utilizes a multiple-type tape which can prevent the active surface of the wafer from the pollution of scraps of the wafer during the sawing process or solve the scrape problem resulted from foreign objects. Furthermore, the multiple-type tape can support the thin wafer and prevent the thin wafer from exhibiting die chipping.

Figure 16:
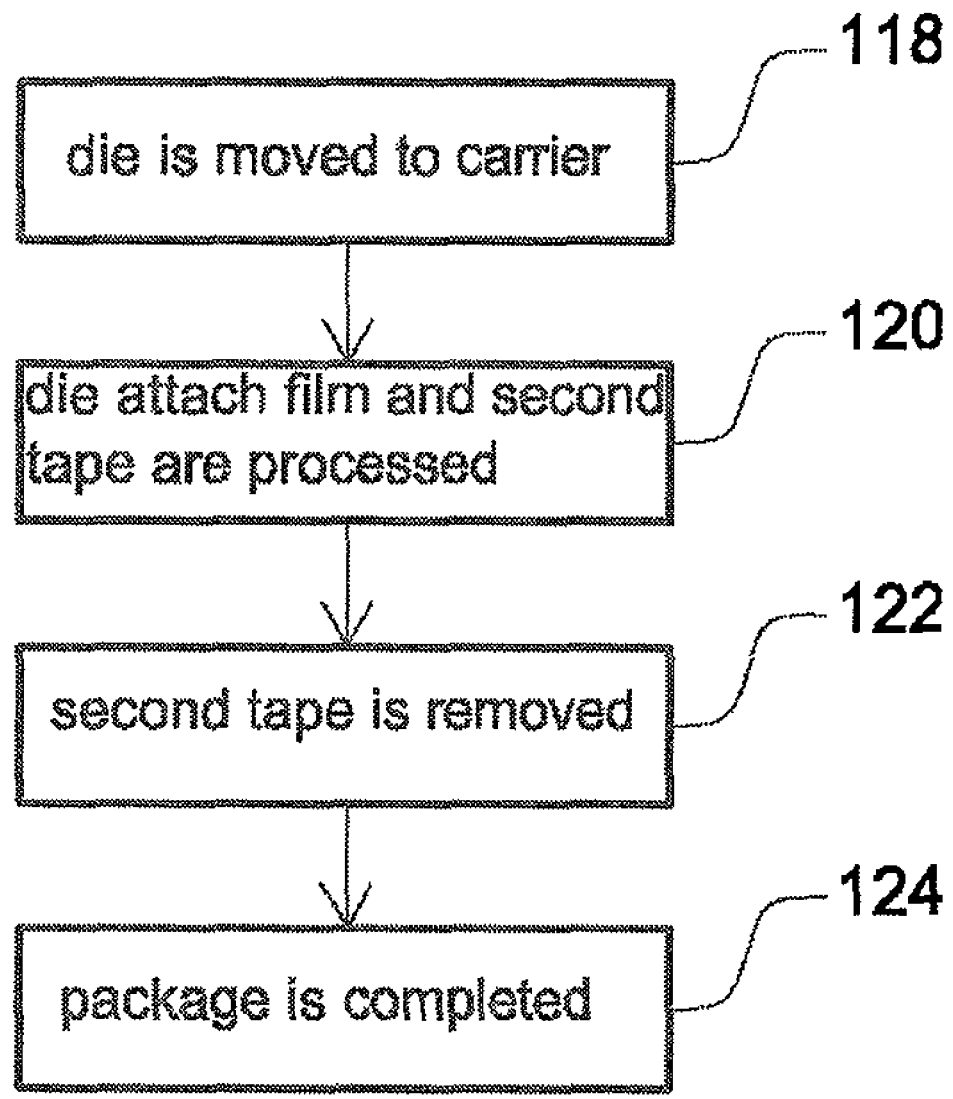
FIG. 16 is a flow diagram showing a method for manufacturing a semiconductor package according to an embodiment of the present invention.
Figure 17:
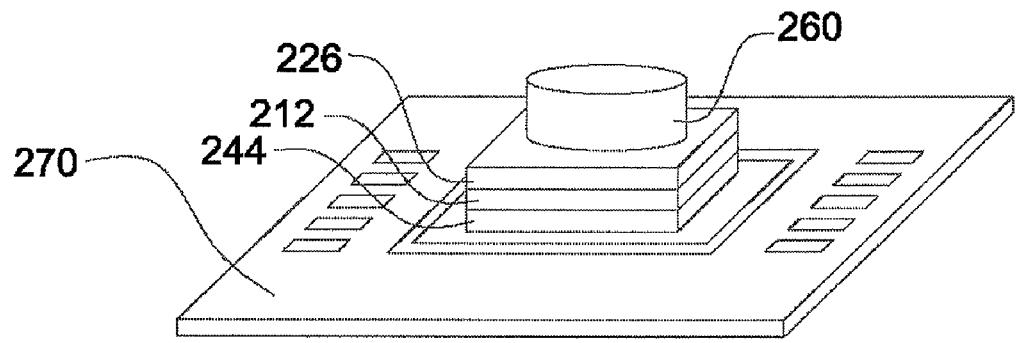
FIGS. 17 to 18 are perspective views showing a method for manufacturing a semiconductor package according to the embodiment of the present invention.
Figure 18:
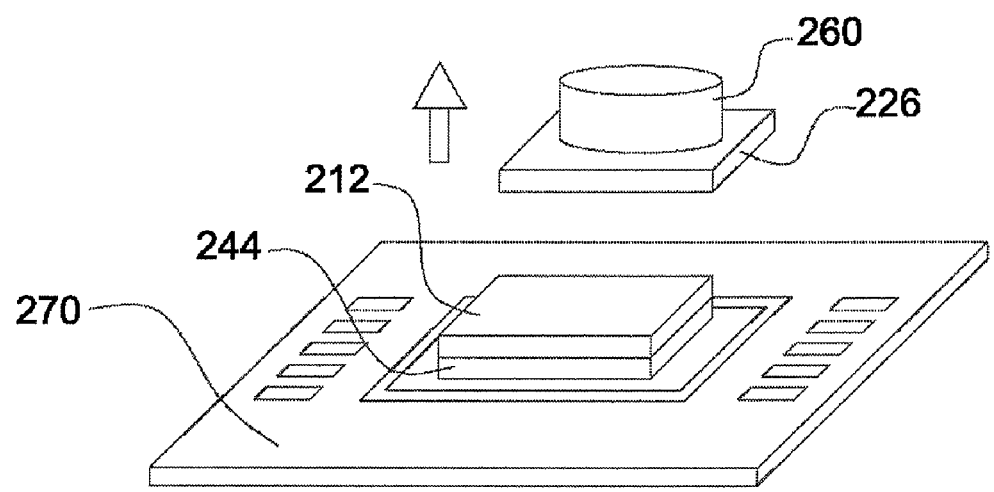

Referring to FIG. 16, it depicts a method for manufacturing a semiconductor package according to an embodiment of the present invention. Referring to FIG. 17, in the step 118 the die 212 (shown in the step 116 of the above-mentioned method for sawing the wafer) is moved to a carrier 270 (e.g. substrate or leadframe) by the vacuum device 260, wherein the second tape 226 and the die attach film 244 are still attached on the die 212. In the step 120, the die 212 is mounted on the carrier 270 and the adhesion of the second tape 226 can be destroyed by a method for simultaneously processing the die attach film 244 and the second tape 226. For example, the die 212 can be mounted on the carrier 270 and the adhesion of the second adhesive layer 228 of the second tape 226 can be destroyed by a thermal energy (e.g. the thermal energy is generated by heating the second adhesive layer 228 to approximately 130 to 150 degrees centigrade). Referring to FIG. 18, in the step 122 the second tape 226 is removed by the vacuum device 260. Finally, in the step 124 a semiconductor package is completely manufactured by a packaging process. The packaging process includes a wire bonding step and an encapsulating step.

Figure 19:
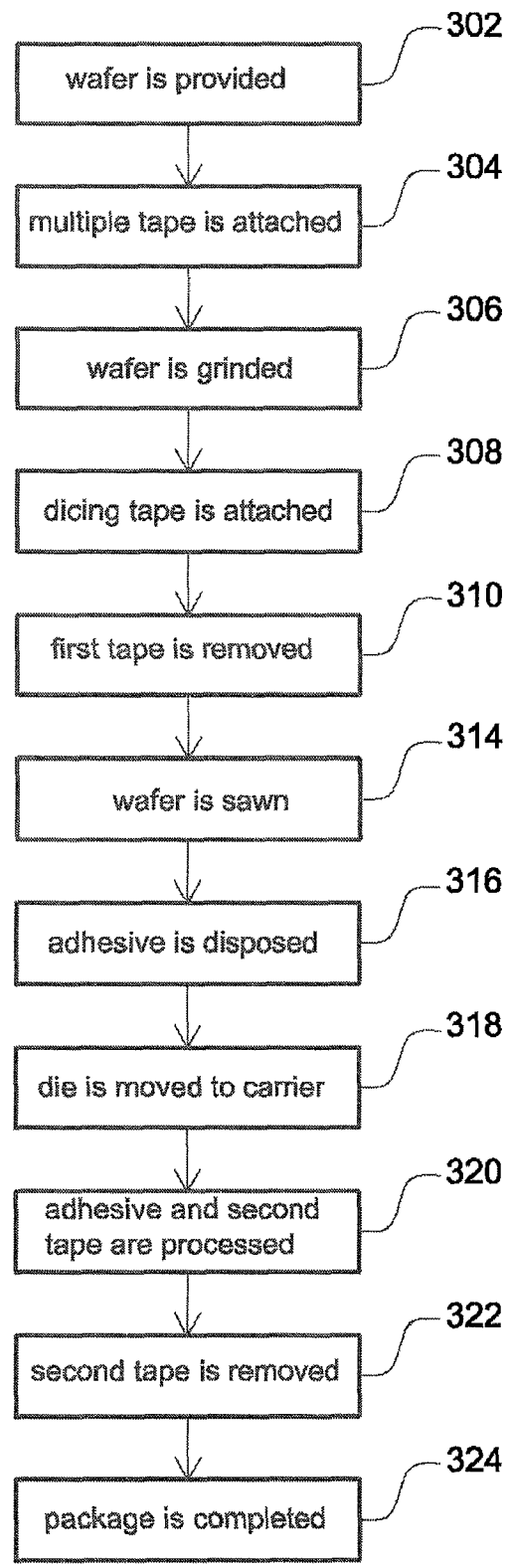
FIG. 19 is a flow diagram showing a method for manufacturing a semiconductor package according to another embodiment of the present invention.
Figure 20:
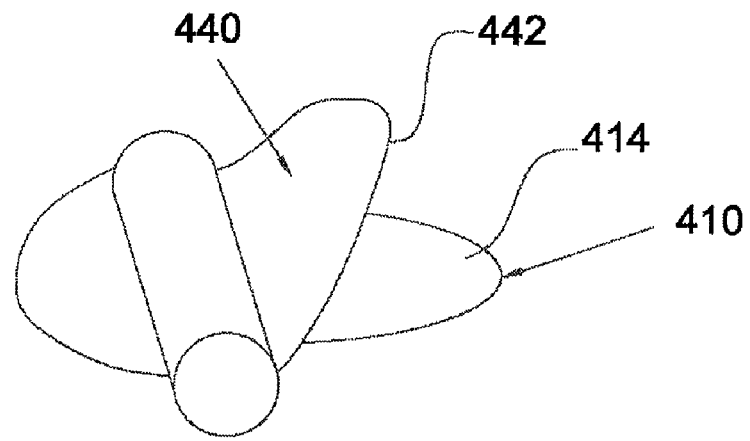
FIGS. 20 to 21 are perspective views showing a method for sawing a wafer according to another embodiment of the present invention.
Figure 21:
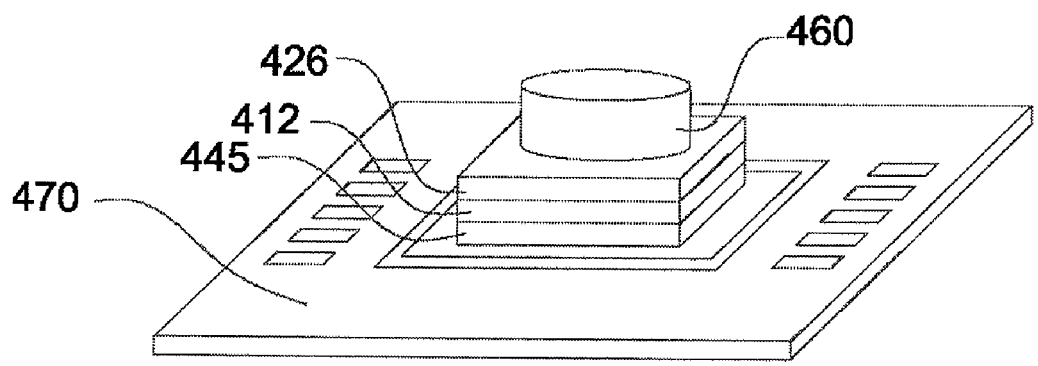

Referring to FIG. 19, it depicts a method for manufacturing a semiconductor package according to another embodiment of the present invention. The method for manufacturing the semiconductor package includes the following steps. In the step 302, a wafer which has an active surface, a back surface and a plurality of longitudinal and transverse sawing lines is provided, wherein the sawing lines are located on the active surface so as to define a plurality of dies. In the step 304, a multiple-type tape is attached on the active surface of the wafer, wherein the multiple-type tape includes a first tape and a second tape, the second tape is located between the first tape and the active surface of the wafer, and the second tape is transparent. In the step 306, the back surface of the wafer is grinded. In the step 308, a dicing tape 440 is attached on the back surface 414 of the grinded wafer 410, wherein the dicing tape 440 only includes a bottom film 442, shown in FIG. 20. In the step 310, the first tape is removed. In the step 314, the wafer including the second tape is sawn along the sawing lines so as to separate the dies from one another. In the step 316, an adhesive is disposed on a carrier (e.g. substrate or leadframe). In the step 318, the die 412 including the second tape 426 is moved to the adhesive 445 of the carrier 470 by the vacuum device 460, shown in FIG. 21. In the step 320, the die is mounted on the carrier and the adhesion of the second tape can be destroyed by a method for simultaneously processing the adhesive and the second tape. For example, the die can be mounted on the carrier and the adhesion of the second adhesive layer of the second tape can be destroyed by a thermal energy (e.g. the thermal energy is generated by heating the second adhesive layer to approximately 130 to 150 degrees centigrade). In the step 322 the second tape is removed by the vacuum device. Finally, in the step 324 a semiconductor package is completely manufactured by a packaging process. The packaging process includes a wire bonding step and an encapsulating step.

The method for manufacturing the semiconductor packages according to the present invention utilizes the second tape of the multiple-type tape which can prevent the active surface of the wafer from the pollution or solve the scrape problem resulted from foreign objects. Furthermore, compared with the prior art, it is not necessary that the active surface of the wafer is cleaned by a plasma clean process in the method for manufacturing the semiconductor package according to the present invention so as not to increase the manufacture time and cost.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A method for sawing a wafer comprising the following steps of:
   providing a wafer which has an active surface, a back surface and a plurality of longitudinal and transverse sawing lines, wherein the sawing lines are located on the active surface so as to define a plurality of dies;
   attaching a multiple tape on the active surface of the wafer, wherein the multiple tape includes a first tape and a second tape, the second tape is located between the first tape and the active surface of the wafer, wherein a force of adhesion between the first tape and the second tape is smaller than a force of adhesion between the second tape and the wafer, and the second tape is transparent;
   grinding the back surface of the wafer;
   removing the first tape; and
   sawing the wafer including the second tape along the sawing lines so as to separate the dies from one another.

2. The method as claimed in claim 1, wherein the first tape includes a first base and a first adhesive layer, and the second tape includes a second base and a second adhesive layer.

3. The method as claimed in claim 2, wherein the adhesion value of the first adhesive layer is less than that of the second adhesive layer.

4. The method as claimed in claim 2, wherein the thickness of the first base is approximately 90 μm, the thickness of the first adhesive layer is approximately 10 μm, the thickness of the second base is approximately 90 μm, and the thickness of the second adhesive layer is approximately 20 μm.

5. The method as claimed in claim 2, wherein the second base is made of material having a predetermined hardness value.

6. The method as claimed in claim 1, further comprising the following step of:
   attaching a dicing tape on the back surface of the grinded wafer, wherein the dicing tape includes a bottom film and a die attach film.

7. The method as claimed in claim 6, further comprising the following step of:
   moving the sawn die so as to finish singularizing the dies, wherein the second tape and the die attach film are attached on the dies.

8. A method for manufacturing a semiconductor package comprising the following steps of:
   moving the die as claimed in claim 7 to a carrier, wherein the second tape and the die attach film are still attached on the dies;
   mounting the die on the carrier and destroying the adhesion of the second tape by a method for simultaneously processing the die attach film and the second tape;
   removing the second tape; and
   completing the semiconductor package by a packaging process.

9. The method as claimed in claim 8, wherein the carrier is a substrate or a leadframe.

10. The method as claimed in claim 8, wherein the method for processing the die attach film and the second tape is to use a thermal energy.

11. The method as claimed in claim 8, wherein the packaging process includes a wire bonding step and an encapsulating step.

12. A method for manufacturing semiconductor package comprising the following steps of:
   providing a wafer which has an active surface, a back surface and a plurality of longitudinal and transverse sawing lines, wherein the sawing lines are located on the active surface so as to define a plurality of dies;
   attaching a multiple tape on the active surface of the wafer, wherein the multiple tape includes a first tape and a second tape, the second tape is located between the first tape and the active surface of the wafer, wherein a force of adhesion between the first tape and the second tape is smaller than a force of adhesion between the second tape and the wafer, and the second tape is transparent;
   grinding the back surface of the wafer;
   attaching a dicing tape on the back surface of the grinded wafer, wherein the dicing tape includes a bottom film;
   removing the first tape;
   sawing the wafer including the second tape along the sawing lines so as to separate the dies from one another;
   disposing an adhesive on a carrier;
   moving the die including the second tape to the adhesive of the carrier;
   mounting the die on the carrier and destroying the adhesion of the second tape by a method for simultaneously processing the adhesive and the second tape;
   removing the second tape; and
   completing the semiconductor package by a packaging process.

13. The method as claimed in claim 12, wherein the carrier is a substrate or a leadframe.

14. The method as claimed in claim 12, wherein the method for destroying the second tape is to use a thermal energy.

15. The method as claimed in claim 12, wherein the packaging process includes a wire bonding step and an encapsulating step.

* * * * *